United States Patent
McBride et al.

(10) Patent No.: US 6,279,143 B1
(45) Date of Patent: Aug. 21, 2001

(54) METHOD AND APPARATUS FOR GENERATING A DATABASE WHICH IS USED FOR DETERMINING THE DESIGN QUALITY OF NETWORK NODES

(75) Inventors: John G McBride, Ft Collins; Jan Kok, Fort Collins, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/274,798

(22) Filed: Mar. 23, 1999

(51) Int. Cl.[7] .................................................... G06F 17/50
(52) U.S. Cl. ..................................................... 716/5; 716/6
(58) Field of Search ............................................... 716/5, 6

(56) References Cited

U.S. PATENT DOCUMENTS

| | | | |
|---|---|---|---|
| 5,796,985 | * 8/1998 | O'Brien et al. ........................... | 716/6 |
| 5,880,967 | * 3/1999 | Jyu et al. .................................. | 716/6 |
| 5,966,521 | * 10/1999 | Takeuchi et al. ......................... | 716/6 |
| 6,023,567 | * 2/2000 | Osler et al. ............................... | 716/6 |

* cited by examiner

Primary Examiner—Trong Phan (57) ABSTRACT

A method and apparatus for generating a database to be utilized by a rules checker for evaluating the quality of a particular design, such as, for example, an integrated circuit design. The design to be evaluated comprises a plurality of elements coupled together by at least one node. The apparatus of the present invention comprises a computer running a database generation program which receives, as its input to the database generation program, information relating to characteristics of the elements and nodes. The database generation program utilizes the input to produce a data structure for each of the elements and nodes. These data structures comprise the database which can be utilized by the rules checker to evaluate the quality of the design. In accordance with the preferred embodiment of the present invention, the input to the database generation program corresponds to the output of a timing analyzer program which is being executed by the computer. The design is an electrical circuit design and the output of the static timing analyzer program includes statistical and other information relating to the elements and nodes in the electrical circuit design. This information is then utilized by the database generation program to generate the data structures for the elements and nodes. These data structures comprise the database which is utilized by the rules checker program to evaluate the quality of the circuit design.

20 Claims, 5 Drawing Sheets

METHOD AND APPARATUS FOR GENERATING A DATABASE WHICH IS USED FOR DETERMINING THE DESIGN QUALITY OF NETWORK NODES

TECHNICAL FIELD OF THE INVENTION

The present invention generally relates to computer-aided circuit design systems and, more particularly, to a method and apparatus for creating a database which may be used for determining the design quality of network nodes in an integrated circuit.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electromechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules, including all of the components within the modules. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. The present invention provides a method and apparatus for building a database which can be utilized by such rules checking system to determine the design quality of circuits. The present invention works in conjunction with a tool such as PathMill to build the database of the present invention. Typically, such tools, including PathMill, receive a netlist and use the netlist to determine FET (field effect transistor) direction, node types, latches, dynamic gates, rise and fall times, etc. This information can be utilized by the present invention to build a database which can then be utilized by a rules checking program to determine design quality of FET-level circuits designed in accordance with VLSI techniques.

SUMMARY OF THE INVENTION

The present invention provides a method and apparatus for generating a database to be utilized by a rules checker for evaluating a particular design, such as, for example, an integrated circuit design. The design to be evaluated comprises a plurality of elements coupled together by at least one node. The apparatus of the present invention comprises a computer running a database generation program which receives, as its input to the database generation program, information relating to characteristics of the elements and nodes. The database generation program utilizes the input to produce a data structure for each of the elements and nodes. These data structures comprise the database which can be utilized by the rules checker to evaluate the design.

In accordance with the preferred embodiment of the present invention, the input to the database generation program corresponds to the output of a timing analyzer program which is being executed by the computer. The design is an electrical circuit design and the output of the static timing analyzer program includes statistical information relating to the elements, and pointers relating to the locations of the elements in the electrical circuit design. The pointers relate to the locations of the elements in the circuit and typically denote locations of a source, a drain and a gate of a field effect transistor. The database generation program utilizes the statistical information and the pointers in generating the data structures of the elements.

The output of the timing analyzer also includes information relating to whether any of the nodes are tied to a voltage supply, and the database generation program preferably also utilizes this information in generating the data structures of the nodes. The output of the timing analyzer includes information relating to the number of gate-connected elements and channel-connected elements contained in the circuit being analyzed by the timing analyzer. The database generation program preferably also utilizes this information in generating the data structure of the nodes. Other information output from the timing analyzer may also be utilized in generating the database generation program, such as, for example, information relating to characteristics of the nodes, such as capacitance, node type, and rise and fall time.

The output of the timing analyzer typically also includes pointers to each gate-connected element and to each channel-connected element. The database generation program preferably also utilizes these pointers in generating the data structure of said at least one node. Preferably, the pointers output from the timing analyzer are mapped into pointers in the database generation program space. The computer preferably utilizes a hash table for mapping the pointers from the timing analyzer into pointers into the space of the database generation program. The terminals of each gate-connected element and of each channel-connected element are then set to point to the data structure of the node to which the terminals are connected.

Preferably, the computer then generates a linked list, which corresponds to a list of all of the elements of the circuit being evaluated. The linked list may then be used by the database generation program to search for elements during the generation of the element and node data structures. Once the linked list has been generated, the names of the elements contained in the linked list preferably are copied into the space of the database generation program.

DETAILED DESCRIPTION OF THE PRESENT INVENTION

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Figure 1:
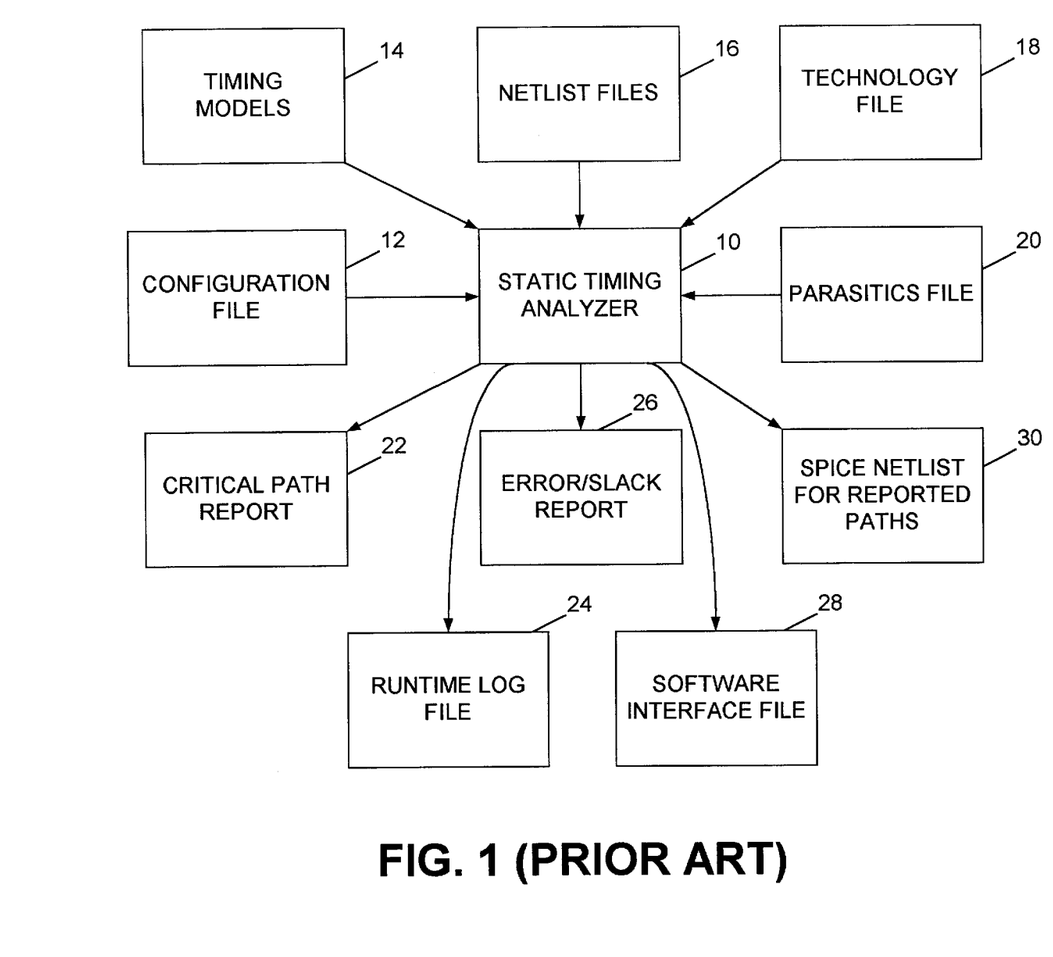
FIG. 1 is a block diagram of a static timing analyzer system, as is known in the prior art.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration file(s) 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations.

Figure 2:
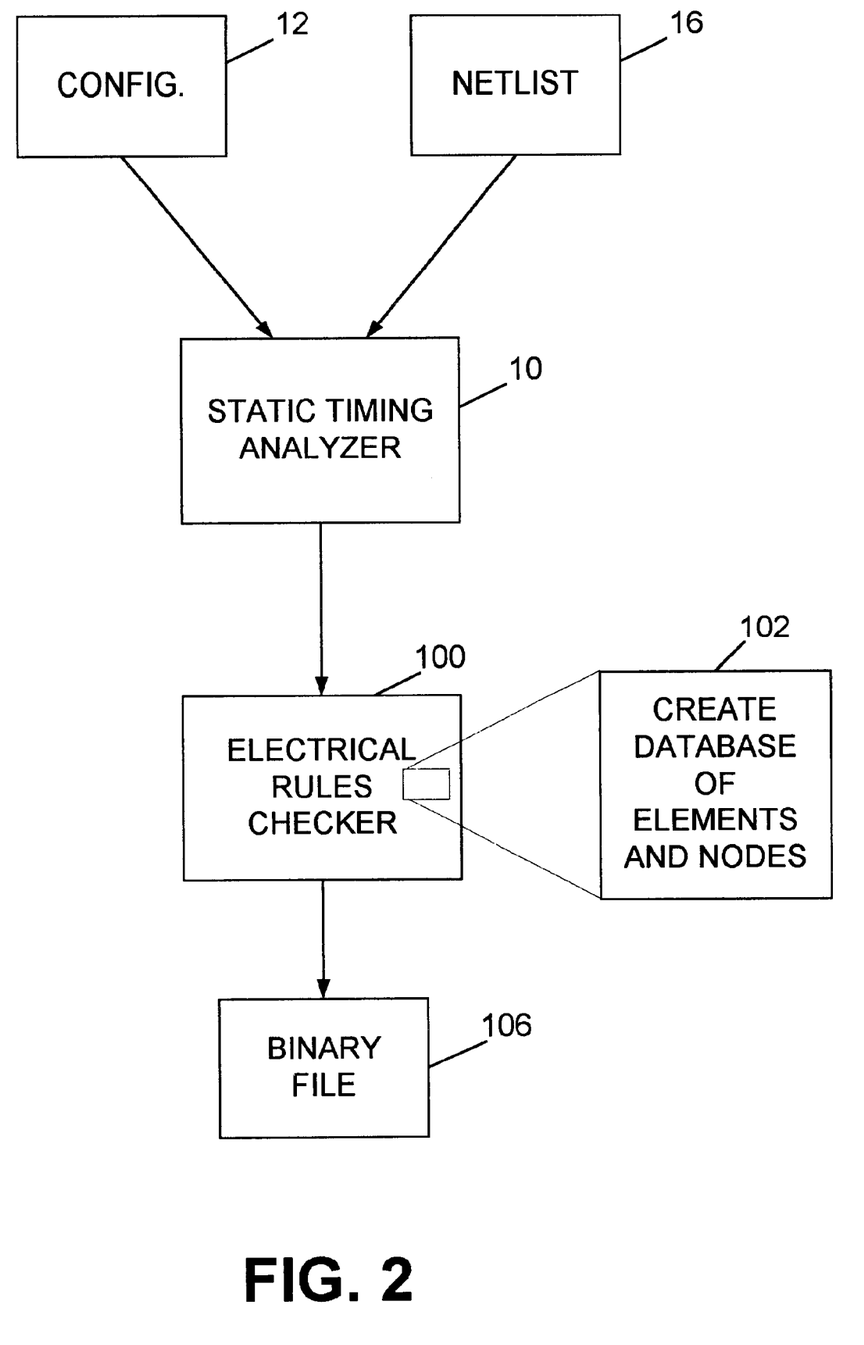
FIG. 2 is a block diagram illustrating the orientation of the electrical rules checking method of the present invention, in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion of the electrical rules checker program 100 operates to identify NOR gates and NAND gates within an integrated circuit design. This is only one example of the multitude of checks which may be performed by the electrical rules checker program 100 of the present invention.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated must be generated. This database is then utilized by the electrical rules checker 100 of the present invention to perform the rules checking tasks. However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for optical computing systems, mechanical systems and chemical systems. It will be apparent to those skilled in the art how data structures similar to those generated for elements and nodes in the electrical context may be generated in mechanical, chemical and optical computing contexts and used for rules checking in those contexts.

The manner in which this database is generated will now be discussed below with respect to FIGS. 3A–3C. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate the database of the present invention, as indicated by block 102.

Prior to the database of the present invention being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

Figure 3A:
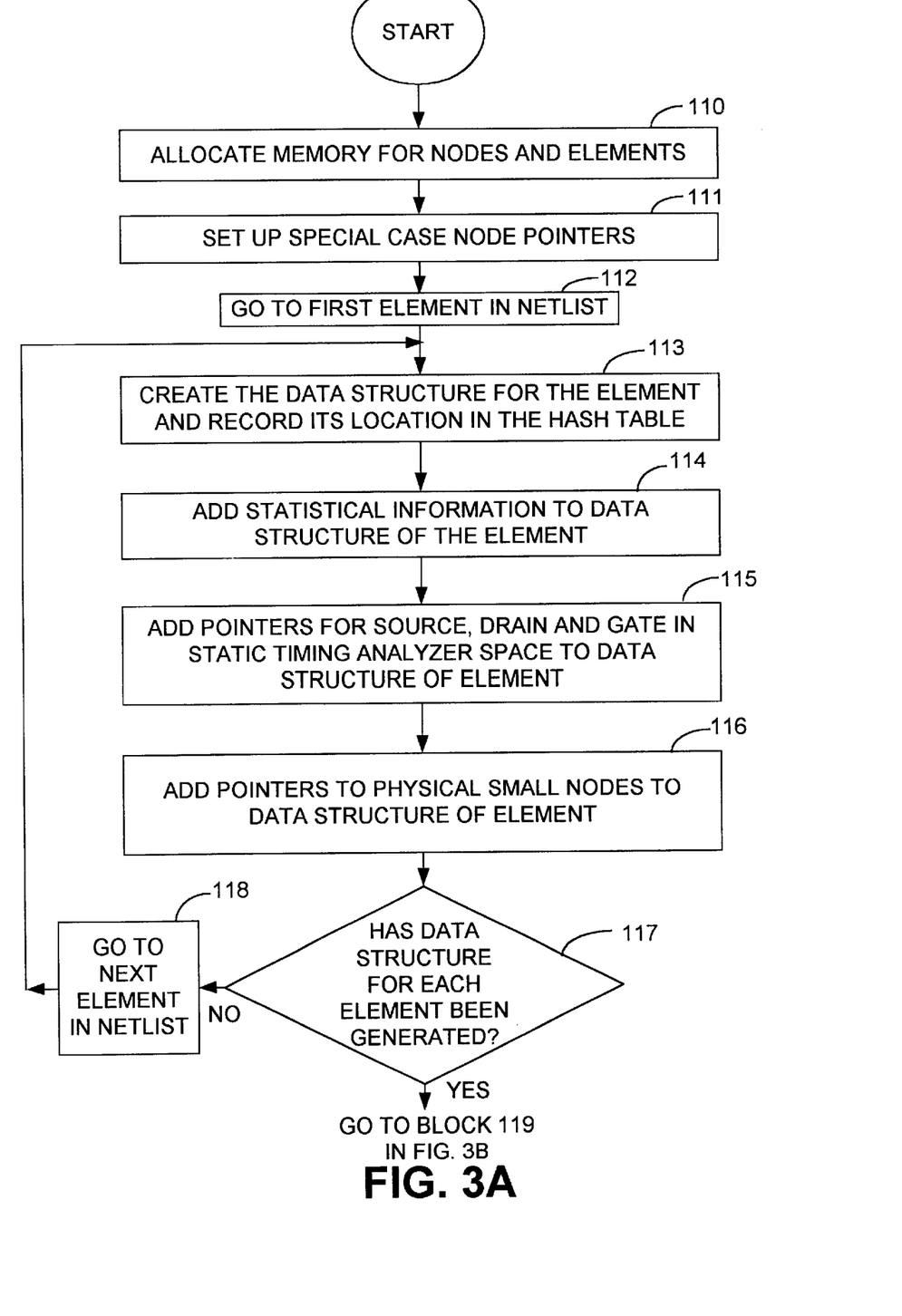
FIGS. 3A–3C together form a flow chart which illustrates the method of the present invention for generating the database of the present invention which can be utilized by a rules checking program to perform rules checking tasks.
Figure 3B:
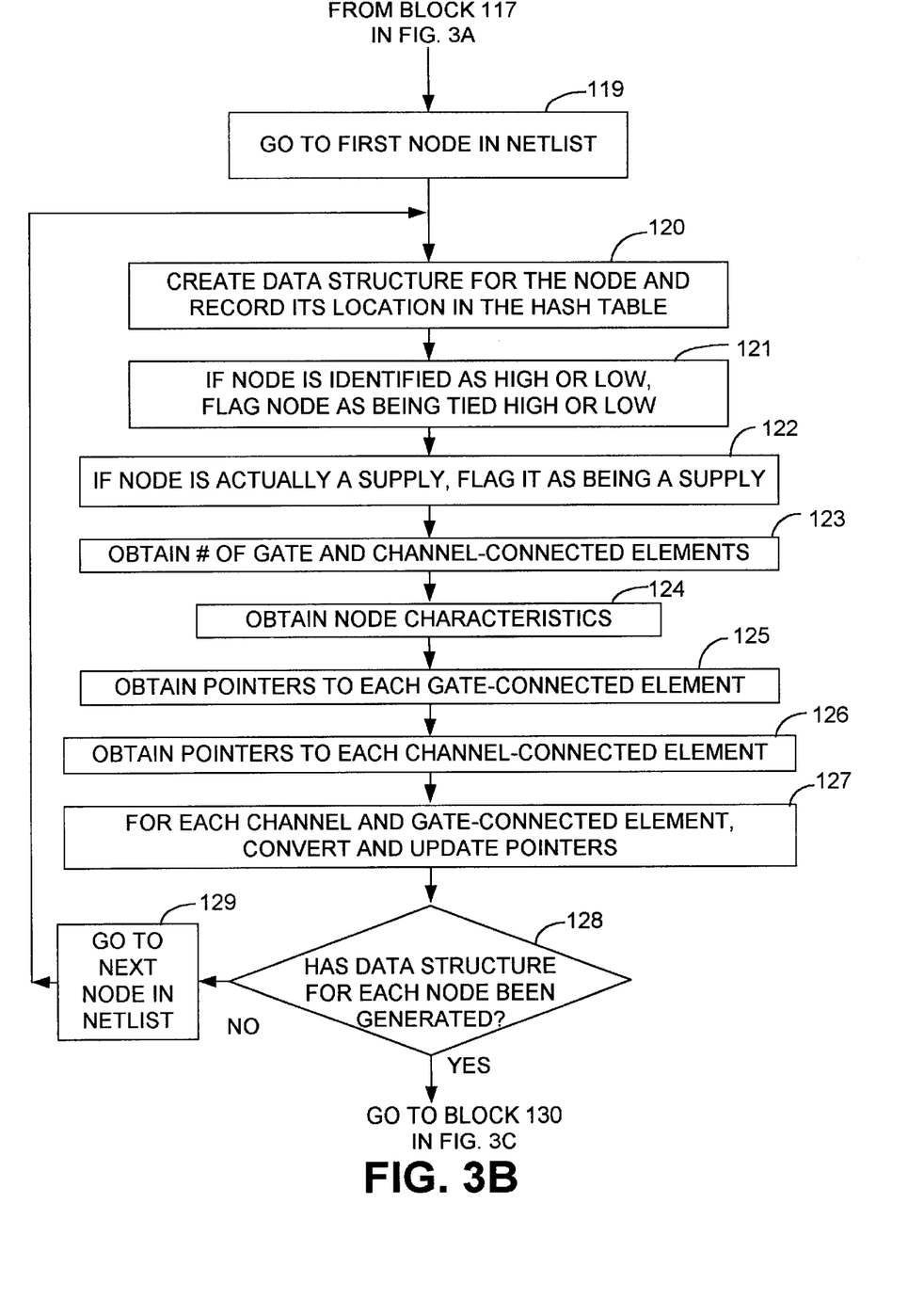

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes must be generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags declared or actual high nodes as high and declared or actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figure 3C:
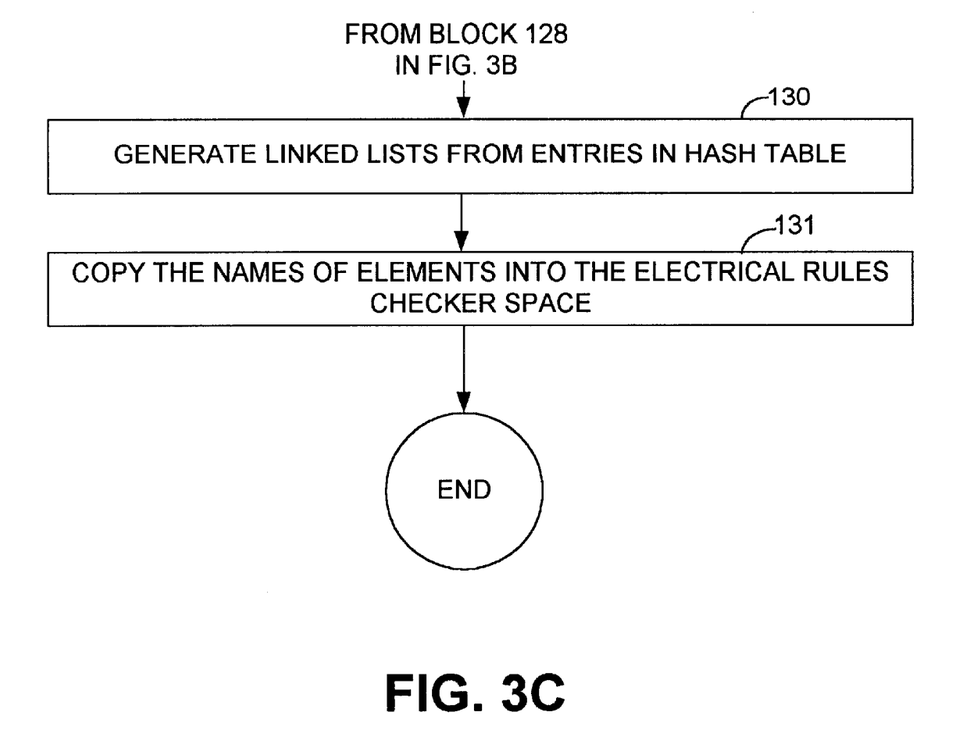

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention when searching for an element or node in the database of the present invention.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Once the database of the present invention has been generated in the manner described above, the electrical rules checker 100 of the present invention utilizes this database to perform the rules checking tasks. The manner in which the specific rules checking tasks are performed is not the subject of the present application and, therefore, in the interest of brevity, a discussion of the manner in which these tasks are performed will not be provided herein.

The foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. An apparatus for generating a database to be utilized by a rules checker for evaluating a particular design, the design comprising at least one element coupled together by at least one node, said apparatus comprising:

a computer running a database generation program, the database generation program receiving input relating to characteristics of said at least one element and to characteristics of said at least one node, said database generation program utilizing the input to produce a data structure for each element and each node, wherein the element and node data structures comprise the database, and wherein the database can be utilized by the rules checker to evaluate the design.

2. The apparatus of claim 1, wherein the input to the database generation program corresponds to the output of a timing analyzer program which is being executed by the computer, wherein the design is an electrical circuit design and wherein the output of the static timing analyzer program includes statistical information relating to said at least one element and pointers relating to the locations of said at least one element in a circuit being analyzed by the timing analyzer, and wherein the database generation program utilizes the statistical information and the pointers in generating the data structures of said at least one element.

3. The apparatus of claim 2, wherein the output of the timing analyzer includes information relating to whether said at least one node is tied to a voltage supply, and wherein the database generation program utilizes the information relating to whether or not the node is tied to a voltage supply in order to generate the data structure of the node.

4. The apparatus of claim 3, wherein said at least one element is a field effect transistor, and wherein at least one of the pointers points to a node to which a source of the field effect transistor is attached, wherein at least one of the pointers points to a node to which a drain of the field effect transistor is attached, and wherein at least one of the pointers points to a node to which a gate of the field effect transistor is attached.

5. The apparatus of claim 4, wherein the electrical circuit design includes a plurality of elements and a plurality of nodes, at least some of the elements being channel-connected elements and at least some of the elements being gate-connected elements, wherein the output of the timing analyzer includes information relating to the number of gate-connected elements and channel-connected elements connected to each node contained in the circuit being analyzed by the timing analyzer, and wherein the database generation program utilizes the information relating to the number of gate-connected and channel-connected elements connected to a particular node in generating the data structure of that particular node.

6. The apparatus of claim 5, wherein the output of the timing analyzer includes information relating to characteristics of each node, the characteristics of each node including capacitance, node type, and rise and fall time, the database generation program utilizing the information relating to the characteristics of each node to generate the data structure of each node.

7. The apparatus of claim 6, wherein the output of the timing analyzer includes pointers to each gate-connected element and to each channel-connected element, and wherein the database generation program utilizes these pointers to the gate-connected and channel-connected elements in generating the data structure of each node.

8. The apparatus of claim 7, wherein the pointers output from the timing analyzer are mapped into pointers which point into a space of the database generation program, wherein the computer utilizes a hash table for mapping the pointers from the timing analyzer into pointers which point into the space of the database generation program.

9. The apparatus of claim 8, wherein each gate-connected element and each channel-connected element comprises terminals, and wherein the terminals of each gate-connected element and of each channel-connected element are set to point to the data structure of the node to which the terminals are connected.

10. The apparatus of claim 9, wherein once the computer has generated the data structures of the nodes and elements, a linked list is generated which corresponds to a list of all of the elements of the circuit being evaluated, and wherein the linked list is used by the database generation program to search for elements during the generation of the element and node data structures.

11. The apparatus of claim 10, wherein once the linked list has been generated, the names of the elements contained in the linked list are copied into the space of the database generation program.

12. A method for generating a database to be utilized by a rules checker for evaluating a particular design, the design comprising at least one element coupled to at least one node, the method comprising the steps of:

receiving, as input to a database generation program being executed by a computer, information relating to characteristics of said at least one element and information relating to characteristics of said at least one node;

utilizing, in said database generation program, the input to produce a data structure for each element and each node, wherein the element and node data structures comprise the database, and wherein the database can be utilized by the rules checker to evaluate the design.

13. The method of claim 12, wherein the input to the database generation program corresponds to the output of a timing analyzer program which is being executed by the computer, wherein the design is an electrical circuit design and wherein the output of the static timing analyzer program includes statistical information relating to said at least one element and pointers relating to the location of said at least one element in a circuit being analyzed by the timing analyzer, wherein the input to the database generation program includes the statistical information and the pointers, and wherein the database generation program utilizes the statistical information and the pointers in generating the data structures of said at least one element.

14. The method of claim 13, wherein the output of the timing analyzer includes information relating to whether said at least one node is tied to a voltage supply, wherein the input to the database generation program includes the information relating to whether or not the node is tied to a voltage supply, and wherein the database generation program utilizes the information relating to whether or not the node is tied to a voltage supply in order to generate the data structure of the node.

15. The method of claim 14, wherein said at least one element is a field effect transistor, and wherein at least one of the pointers points to a node to which a source of the field effect transistor is attached, wherein at least one of the pointers points to a node to which a drain of the field effect transistor is attached, and wherein at least one of the pointers points to a node to which a gate of the field effect transistor is attached.

16. The method of claim 15, wherein the electrical circuit design includes a plurality of elements and a plurality of nodes, at least some of the elements being channel-connected elements and at least some of the elements being gate-connected elements, wherein the output of the timing analyzer includes information relating to the number of gate-connected elements and channel-connected elements contained in the circuit being analyzed by the timing analyzer, wherein the input to the database generation program includes the information relating to the number of gate-connected and channel-connected elements, and wherein the database generation program utilizes the information relating to the number of gate-connected and channel-connected elements connected to a particular node in generating the data structure of that particular node.

17. The method of claim 16, wherein the output of the timing analyzer includes information relating to characteristics of each node, the characteristics of each node including capacitance, node type, and rise and fall time, wherein the input to the database generation program includes the information relating to the characteristics of each node, and wherein the database generation program utilizes the information relating to the characteristics of each node to generate the data structure of each node.

18. The method of claim 17, wherein the output of the timing analyzer includes pointers to each gate-connected element and to each channel-connected element, wherein the input to the database generation program includes these pointers to the gate-connected and channel-connected elements, and wherein the database generation program utilizes these pointers to the gate-connected and channel-connected elements in generating the data structure of each node, wherein the pointers output from the timing analyzer are mapped into pointers which point into a space of the database generation program, wherein the computer utilizes a hash table for mapping the pointers from the timing analyzer into pointers which point into the space of the database generation program.

19. The method of claim 18, wherein each gate-connected element and each channel-connected element comprises terminals, and wherein the terminals of each gate-connected element and of each channel-connected element are set to point to the data structure of the node to which the terminals are connected, and wherein once the computer has generated the data structures of each node and of each element, a linked list is generated which corresponds to a list of all of the elements of the circuit being evaluated, and wherein the linked list is used by the database generation program to search for elements during the generation of the element and node data structures, and wherein once the linked list has been generated, the names of the elements contained in the linked list are copied into the space of the database generation program.

20. A database generation program embodied on a computer-readable medium, the database generation program capable of being utilized by a rules checker for evaluating a particular design, the design comprising at least one element coupled to at least one node, the program comprising:

a first code segment which receives information relating to characteristics of said at least one element and information relating to characteristics of said at least one node;

a second code segment which utilizes the received information to generate a data structure for each element and each node, wherein the element and node data structures comprise the database, and wherein the database can be utilized by the rules checker to evaluate the design.

* * * * *